United States Patent [19]

Armstrong

[11] 3,894,286

[45] July 8, 1975

[54] TEMPERATURE COMPENSATED VOLTAGE TUNABLE CIRCUITS USING SURFACE WAVE DEVICES

[75] Inventor: Donald B. Armstrong, Belmont, Calif.

[73] Assignee: Crystal Technology, Inc., Mountain View, Calif.

[22] Filed: Jan. 28, 1974

[21] Appl. No.: 437,275

[52] U.S. Cl. ................ 325/438; 325/442; 325/489; 331/107 A; 333/30 R

[51] Int. Cl.²........................................... H04B 1/26

[58] Field of Search ........... 325/434, 445, 430, 438, 325/442, 489; 331/96, 107 R, 107 A, 154, 155, 158, 163, 176; 333/29, 30 R, 70 S, 71, 72, 82 BT, 83 T, 95 S; 178/5.8 AF

[56] References Cited

UNITED STATES PATENTS

| | | | |
|---|---|---|---|
| 3,314,022 | 4/1967 | Meitzler | 331/155 |
| 3,559,115 | 1/1971 | De Vries | 333/30 |
| 3,568,102 | 3/1971 | Tseng | 333/30 |
| 3,582,540 | 6/1971 | Adler | 333/30 |
| 3,737,785 | 6/1973 | Korpel | 325/442 |
| 3,766,496 | 10/1973 | Whitehouse | 330/30 R |
| 3,786,373 | 1/1974 | Schulz et al. | 330/30 R |
| 3,787,612 | 1/1974 | De Vries et al. | 178/5.8 AF |

*Primary Examiner*—Robert L. Griffin
*Assistant Examiner*—Jin F. Ng
*Attorney, Agent, or Firm*—Townsend and Townsend

[57] ABSTRACT

Electrical circuits which are sensitive to frequency drift with temperature changes are stabilized by employing a matched pair of surface wave devices; the first having a negative temperature coefficient $\alpha_1$; the second having a positive temperature coefficient $\alpha_2$. An oscillator circuit is temperature compensated by inserting a matching pair of surface wave delay elements in the feedback loop and choosing the delay time so that $\alpha_1 t_1 = -\alpha_2 t_2$, where $t_1$, $t_2$ are the delay times provided by the delay elements having temperature coefficients $\alpha_1,\alpha_2$. A first oscillator circuit comprises a single amplifier and a pair of matched surface wave delay elements coupled in tandem in the feedback loop. A second oscillator circuit comprises a pair of amplifiers and a pair of matched surface wave delay elements alternately coupled in a closed loop configuration so that the delay elements are interlaced with the amplifiers. In a receiver system having a mixer, a local oscillator, and an IF filter for converting RF input signals to IF output signals, temperature compensation is achieved by employing a surface wave delay element in the local oscillator feedback loop and a surface wave integratable filter as the IF filter and choosing the temperature coefficients and local and intermediate frequencies so that $\alpha_{LO}f_{LO} = -\alpha_{IF}f_{IF}$, in systems where $f_{LO}<f_{RF}$ and $\alpha_{LO}f_{LO} = \alpha_{IF}f_{IF}$ when $f_{LO}>f_{RF}$, where $\alpha_{LO}$'$\alpha_{IF}$ are the temperature coefficients of the delay element and filter, respectively, and $f_{RF}, f_{IF}$ and $f_{LO}$ are the RF intermediate and local oscillator frequencies, respectively. The oscillator circuits are voltage tuned by providing an intermediate electrode on the active surface of a surface wave delay element and impressing a DC signal or an AC signal or a combination of both between the intermediate electrode and the ground plane of the delay element.

5 Claims, 3 Drawing Figures

TEMPERATURE COMPENSATED VOLTAGE TUNABLE CIRCUITS USING SURFACE WAVE DEVICES

BACKGROUND OF THE INVENTION

This invention relates to electrical circuits which depend for their proper operation on the frequency stability of signals within the circuit. More particularly, this invention relates to frequency sensitive circuits having compensating circuitry for maintaining the frequency stability over a range of temperatures and changes in component values.

Many electrical circuits have been developed which depend for their operation on the frequency stability of signals therewithin. For example, an amplifier having gain G (ω) can be made to oscillate at frequency ω by feeding back a portion B (ω) of the output signal to the input of the amplifier and maintaining the conditions:

$$|G(\omega)| \cdot |B(\omega)| = 1 \qquad (1)$$

$$\Phi G(\omega) + \Phi B(\omega) = 2n\pi \qquad (2)$$

where $\Phi\, G(\omega)$ and $\Phi\, b(\omega)$ are defined as the phase shift provided by the amplifier and the feedback loop, respectively, at frequency ω.

When the feedback loop comprises a delay line, the phase of the feedback signal is given by:

$$\Phi\, B(\omega) = \omega_t \qquad (3)$$

where $t$ is the delay provided by the delay line. If $\Phi G(\omega)$ is slowly varying in ω compared to $\omega_t$, the oscillation frequency is given by:

$$\omega = \frac{2n\pi}{t} - \frac{\Phi G}{t} \qquad (4)$$

where $n$ is an integer. Thus, a set of frequencies exists at which the circuit will oscillate, provided that the above-noted amplitude criteria of equation (1) are satisfied.

Since the operational characteristics of electrical circuit components vary with temperature and with continued use, compensation circuitry is typically provided in frequency sensitive circuits for compensating for these changes in such a manner as to maintain the circuit operative, either automatically or in response to manual adjustment. Such compensation circuitry, however, suffers from several disadvantages. One such disadvantage results from the fact that the additional circuit elements required to construct the compensation circuitry increase the total cost of fabricating the desired unit. Perhaps more seriously, however, the compensating circuitry itself is composed of electrical circuit elements which are subject to parameter changes with temperature and use-lifetime. As a result, the operating characteristics of the compensating circuitry itself can change so that the original purpose therefor is defeated. Efforts to overcome the above and other disadvantages have not met with wide success to date.

SUMMARY OF THE INVENTION

The invention comprises a method and apparatus for providing temperature compensated, voltage tunable frequency sensitive circuits which are inexpensive to fabricate, rugged in construction and extremely stable in operation. In a first embodiment, a pair of complimentary surface wave delay elements are provided in the feedback loop of an oscillator circuit: the one delay element having a negative temperature coefficient $\alpha_1$; the other having a positive temperature coefficient $\alpha_2$ which are defined for present use by the equation $\alpha = 1/t\ \delta t/\delta T$. The delay elements are constructed so that $\alpha_1 t_1 = -\alpha_2 t_2$ where $t_1$, $t_2$ are the delay period provided by the first and second delay elements, respectively.

In an alternate embodiment, the oscillator circuit comprises a pair of amplifiers and a pair of complementary surface wave delay elements alternately coupled in a closed loop so that the delay elements are interlaced with the amplifiers, with the temperature coefficient and delay interval parameters selected as per the first embodiment.

In still another embodiment, a converter circuit including a mixer having an input adapted to be coupled to a source of RF signals is provided with a surface wave integratable filter fabricated on a material which has a positive temperature coefficient $\alpha_{IF}$ and a local oscillator including a surface wave delay element having either a negative or positive temperature coefficient $\alpha_{LO}$ in the feedback loop thereof depending on whether $f_{LO}$ is less than or greater than $f_{RF}$, where $f_{LO}$ and $f_{RF}$ are the local oscillator and RF frequencies respectively. The parameters of the circuit are selected so that $\alpha_{LO} f_{LO} = \mp \alpha_{IF} f_{IF}$ in the two respective cases where $f_{IF}$ is the intermediate frequency.

The above embodiments are provided with a control circuit for enabling voltage tuning thereof. One of the surface wave devices is provided with a control electrode intermediate the input and output transducers thereof. A suitable DC supply or AC source or a combination of both are coupled between the control electrode and the ground plane of the acoustic wave device. By varying the DC supply or AC source, trimming, modulation, or a combination of both may be achieved.

For a fuller understanding of the nature and advantages of the invention, reference should be had to the following detailed description taken in conjunction with the accompanying drawings.

PREFERRED EMBODIMENT OF THE INVENTION

Figures 1, 2, 3:
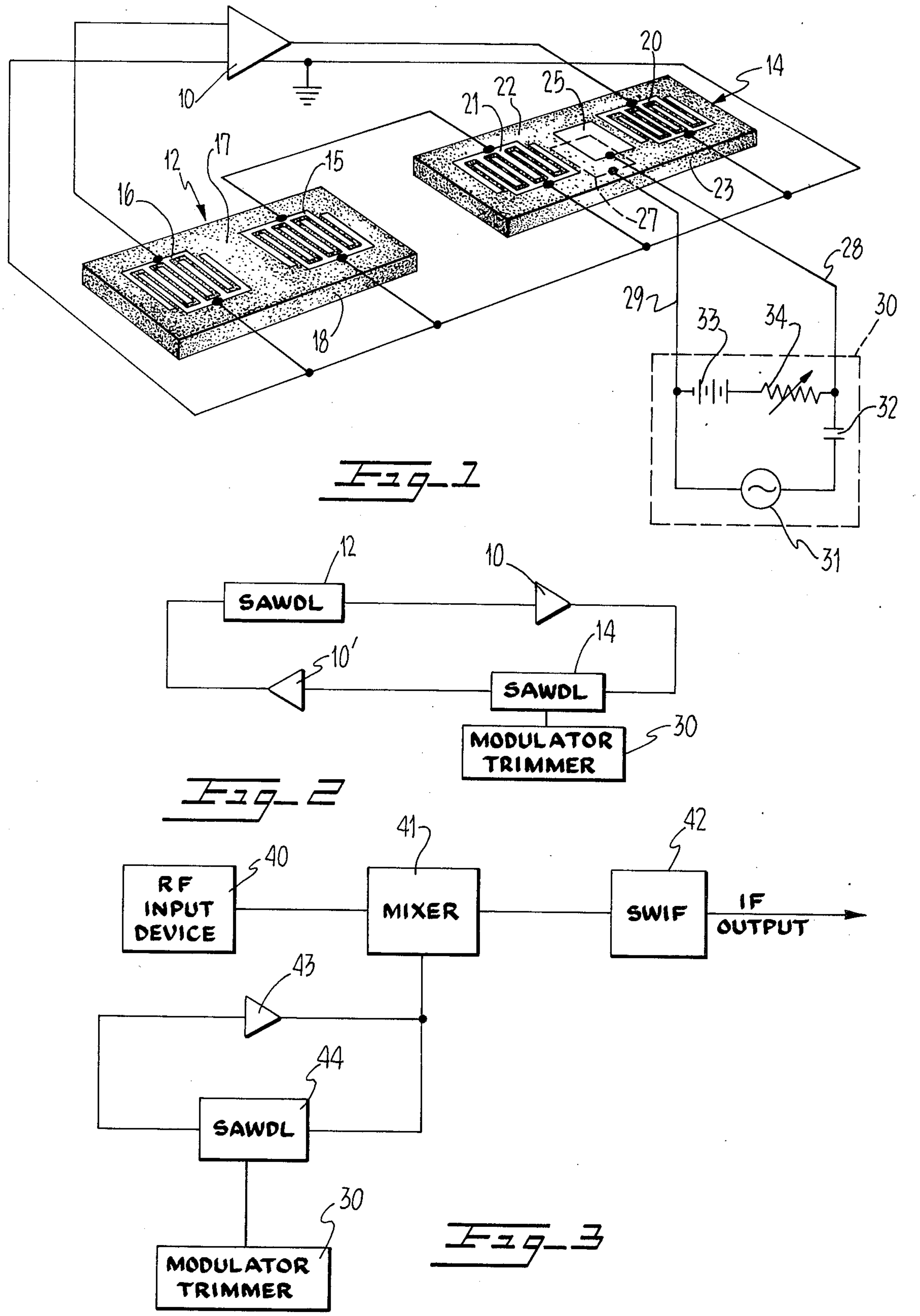
FIG. 1 is a partly schematic perspective view of a first embodiment of the invention.
FIG. 2 is a schematic diagram of a second embodiment of the invention.
FIG. 3 is a schematic diagram of a third embodiment of the invention.

Turning now to the drawings, FIG. 1 illustrates a first embodiment of the invention comprising a temperature compensated, voltage tunable oscillator circuit. The oscillator circuit of FIG. 1 comprises a conventional amplifier 10 and a pair of surface acoustic wave delay elements 12, 14 coupled in a closed loop configuration, with the delay elements 12, 14 coupled in tandem.

Delay element 12 is a surface acoustic wave delay line, hereinafter designated SAWDL, having an input transducer 15 and an output transducer 16. Transducers 15, 16 are conventional interleaved combs of mutually spaced conductive electrodes deposited on propagation surface 17 of a piezo-electric substrate 18. The mutual spacing of the transducer electrodes is selected in accordance with conventional techniques to provide optimum surface wave generation by input transducers 15 and optimum transduction of the surface wave by output transducers 16.

Delay element 14 comprises a SAWDL similar to SAWDL 12 having an input transducer 20 and an output transducer 21 arranged on the propagation surface 22 of a piezoelectric substrate 23. In addition, SAWDL 14 is provided with a control electrode 25 on propagation surface 22 for a purpose described below.

Temperature compensation for the oscillator circuit of FIG. 1 is provided in the following manner. SAWDL 12 is constructed from a piezoelectric substrate 18 having a negative temperature coefficient $\alpha_1$, while SAWDL 14 is constructed from a piezoelectric substrate 23 which has a positive temperature coefficient $\alpha_2$. In addition, piezoelectric substrate 23 of SAWDL 14 preferably comprises a material having a high-coupling coefficient. The delay periods provided by SAWDLs 12, 14 are selected so that $\alpha_1 t_1 = -\alpha_2 t_2$. In addition, the total delay period T provided by SAWDLs 12, 14 is chosen so that equation 4 (see supra) is also satisfied, i.e., $$T = t_1 + t_2 = 2n\pi - \Phi G$$

The delays provided by SAWDLs 14, 12 are simply:

$$t_1 = \frac{l_1}{v_1}$$

$$t_2 = \frac{l_2}{v_2}$$

where $l_1$, $l_2$ are the acoustic lengths of SAWDLs 12, 14 respectively, and $v_1$, $v_2$ are the propagation velocities of the surface acoustic wave along SAWDLs 12, 14, respectively. Thus, temperature compensation will be achieved if $\alpha 1/\alpha 2 = l2/l1 \cdot v_1/v_2$. Accordingly, given the value of the temperature coefficients and the propagation velocities, the acoustic lengths of SAWDLs 12, 14 are preselected in order to satisfy the about relation.

In order to provide voltage tunability for the oscillator circuit of FIG. 1, SAWDL 14 is provided with control electrode 25. Control electrode 25 is a conductive substance which is deposited intermediate transducers 20, 21 so that an electric field may be impressed across the narrow dimension of substrate 23 between control electrode 25 and the ground plane represented by broken line 27. Control element 25 and ground plane 27 are coupled via conductors 28, 29 to the output of a modulator/trimmer 30. Modulator/trimmer 30 comprises an AC source 31 and AC coupling device 32, and a DC source 33 and an adjustable resistance 34 for varying the DC bias supplied to conductors 28, 29.

In use, the delay interval provided by SAWDLs 12, 14 may be adjusted by varying delay time $t_1$ of SAWDL 14. Since delay time $t_1$ is a function of the voltage impressed between control electrode 25 and ground plane 27, $t_1$ may be varied to trim the oscillator circuit frequency by merely adjusting variable resistance 34. Likewise, the oscillator circuit frequency may be modulated by supplying an AC bias signal from oscillator 31 and coupling element 32 to conductors 28, 29 to impress an alternating voltage of a desired frequency between control electrode 25 and ground plane 27. As shown in FIG. 1, this voltage tuning circuit is preferably associated with the SAWDL 14 which is fabricated from piezoelectric material 23 having the high coupling coefficient so that the largest effect can be achieved with small voltage variations. If desired, however, SAWDL 12 which is fabricated from piezoelectric material 18 having a low-coupling coefficient may be provided with this control arrangement.

FIG. 2 shows an alternate embodiment of the oscillator circuit of FIG. 1. In this embodiment, a pair of amplifiers 10, 10' are interspersed in SAWDLs 12, 14 in a closed loop arrangement in order to reduce the gain requirement of the individual amplifiers 10, 10'. The parameters of SAWDLs 12, 14 are chosen in accordance with the above-noted requirements in order to provide temperature compensation and voltage tunability.

FIG. 3 shows another embodiment of the invention comprising a temperature compensated, voltage tunable receiver system for converting RF input signals to IF output signals. In this embodiment, $f_{LO}$ is chosen to be $> f_{RF}$. A conventional RF input device 40, e.g., an antenna, is coupled to the RF input of a conventional mixer 41. The output of mixer 41 is coupled to the input of a surface wave integratable filter 42, hereinafter designated SWIF, the output of which provides IF signals.

The remaining input to mixer 41 is obtained from a local oscillator comprising a conventional amplifier 43 and a single SAWDL 44. SAWDL 44 is provided with a modulator/trimmer 30 of the type described above with reference to FIG. 1.

In the FIG. 3 device, SWIF 42 is a conventional surface wave device constructed from a piezoelectric material which has a high-coupling coefficient with a positive temperature coefficient $\alpha_{IF}$. SAWDL 44 is fabricated from a piezoelectric material having a high-coupling coefficient with a positive temperature coefficient $\alpha_{LO}$ and is provided with a control electrode intermediate the input and output transducers for the purpose of providing tunability as described above. For temperature stabilization, the following relationoship must be satisfied:

$$\frac{\alpha_{LO}}{\alpha_{IF}} = + \frac{f_{IF}}{f_{LO}}$$

where $f_{IF}$ and $f_{LO}$ are the intermediate and local oscillator frequencies, respectively. It is noted that in the FIG. 3 embodiment the paramount criterion is the requirement that the intermediate frequency match the intermediate frequency filter, rather than that the local oscillation remain stable.

The complimentary surface wave devices in the embodiments described above may be fabricated from several suitable piezoelectric materials. For example, in the embodiment of FIGS. 1 and 2, SAWDL may be fabricated from XY cut quartz which has a negative temperature coefficient $\alpha_1$ of approximately −36 ppm per °C, while SAWDL 14 may be fabricated from YZ cut lithium niobate which has a positive temperature coefficent $\alpha_2$ of approximately 94 ppm per °C. In the FIG. 3 embodiment, SAWDL 44 may be fabricated from either XY cut quartz or YZ lithium niobate depending on whether a positive or negative temperature coefficient is desired, and SWIF 42 may be fabricated from YZ cut lithium niobate. Other suitable orientations of quartz which have a negative temperature coefficient are X-cut quartz for propagation directions between approximately −26° and +33° from the Y axis and Y-cut quartz for propagation between approximately ±35° of the X axis. Tellurium dioxide is another piezoelectric material which has a negative temperature coefficient for surface waves along several directions. Most piezoelectric materials have a positive temperature coefficient. The most useful, because of high coupling coefficient, are $LiNbO_3$, $LiTaO_3$ and Bismuth Germanium Oxide. As will not be apparent, the above-described invention enables fabrication of frequency sensitive circuits which are extremely stable over a wide temperature range and which are relatively simple to construct. Further, the circuits may be voltage tuned by the provision of a simple modulator/trimmer in order to compensate for drift in the conventional electrical circuit components found in the associated elements, e.g., amplifiers 10, 10' of FIGS. 1 and 2, and RF input device 40 and amplifier 43 of FIG. 3.

While the above provides a full and complete disclosure of the preferred embodiments of the invention, various modifications, alternate equivalents and constructions may be employed without departing from the true spirit and scope of the invention. Accordingly, the above description and illustrations should not be construed as limiting the scope of the invention, which is defined by the appended claims.

What is claimed is:

1. A temperature compensated receiver, said receiver comprising:

input means for receiving RF signals having a frequency $f_{RF}$;

a mixer having a first input coupled to said input means, and a second input, a surface wave integratable filter having a temperature coefficient $\alpha_{IF}$, said filter having an input coupled to said mixer and an output for furnishing intermediate frequency signals to an output terminal; and a local oscillator coupled to said second input of said mixer, said local oscillator comprising an amplifier and a surface acoustic wave delay line coupled in a closed loop configuration, said surface acoustic wave delay line having a temperature coefficient $\alpha_{LO}$, said temperature coefficients being selected to satisfy the relation $\alpha_{LO} f_{LO} = \alpha_{IF} f_{IF}$, where $F_{LO}$ $f_{IF}$ are the local oscillator and intermediate frequencies, respectively, when $f_{LO} > f_{FR}$: said temperature coefficients being selected to satisfy the relation $\alpha_{LO} f_{LO} = {}^{-}\alpha_{IF} f_{IF}$ when ${}_{LO}f < f_{RF}$.

2. The receiver of claim 1 wherein said surface acoustic wave delay line includes an input transducer, an output transducer, and a control electrode intermediate said input and said output transducers; and further including means coupled to said control electrode for enabling voltage tuning of the delay time provided by said delay line to control the frequency of said local oscillator.

3. The receiver of claim 2 wherein said surface wave integratable filter is fabricated from a piezoelectric material having a relatively high-coupling coefficient.

4. The apparatus of claim 3, wherein said surface wave integratable filter is fabricated from a first piezoelectric material having a positive temperature coefficient and wherein said surface acoustic wave delay line is fabricated from a second piezoelectric material having a negative temperature coefficient.

5. The apparatus of claim 4 wherein said first and second piezoelectric materials comprise YZ cut lithium niobate and XY cut quartz, respectively.

* * * * *